United States Patent [19]

Smith et al.

[11] 4,035,541

[45] July 12, 1977

[54] SINTERED CEMENTED CARBIDE BODY COATED WITH THREE LAYERS

[75] Inventors: Emlyn N. Smith, Ligonier; Louis F. Pochet, Latrobe, both of Pa.

[73] Assignee: Kennametal Inc., Latrobe, Pa.

[21] Appl. No.: 632,608

[22] Filed: Nov. 17, 1975

[51] Int. Cl.² .................. B32B 15/04; C23C 11/08; C23C 11/18
[52] U.S. Cl. .................... 428/217; 148/6; 148/6.3; 148/16.5; 148/16.6; 148/31.5; 427/249; 428/336; 428/409; 428/642; 428/472; 428/539
[58] Field of Search .......... 428/216, 217, 336, 368, 428/457, 472, 539, 212, 409; 148/6.3, 6, 16.5, 16.6, 19, 20.3, 31.5; 29/198; 427/248 R, 248 A, 248 E, 248 J, 249

[56] References Cited

U.S. PATENT DOCUMENTS

| | | | |
|---|---|---|---|
| 3,553,038 | 1/1971 | Ader | 148/20.3 |
| 3,558,445 | 1/1971 | Rix et al. | 427/399 X |
| 3,784,402 | 1/1974 | Reedy | 29/198 X |
| 3,787,223 | 1/1974 | Reedy | 148/20.3 X |
| 3,846,162 | 11/1974 | Bloom | 427/248 |
| 3,874,900 | 4/1975 | Post et al. | 148/31.5 |
| 3,880,600 | 4/1975 | Zboril | 148/16.6 X |
| 3,900,592 | 8/1975 | Kennedy et al. | 428/217 |
| 3,916,052 | 10/1975 | Shattes | 427/249 X |
| 3,959,557 | 5/1976 | Berry | 428/368 |
| 3,969,130 | 7/1976 | Bokros | 428/368 X |

FOREIGN PATENT DOCUMENTS 1,425,633  2/1976  United Kingdom

OTHER PUBLICATIONS

Kieffer et al., "Uber Die Abscheidung Von Hartstoffschichten," Metall, Feb. 1972, Metal-Verlag GmbH, Berlin, pp. 128-132.

*Primary Examiner*—Harold Ansher
*Attorney, Agent, or Firm*—Lawrence R. Burns

[57] ABSTRACT

A triple coated cemented hard metal carbide product in which a cemented metal carbide substrate is coated with, first, a metal carbide coating, in such a manner so as to create a carbon deficient area in the substrate, then, a metal carbo-nitride and, finally, a metal nitride coating so as to take advantage of the metal carbide and metal nitride properties in order to protect the cemented metal carbide substrate from corrosive atmospheres and abrasion due to frictional wear.

9 Claims, 1 Drawing Figure

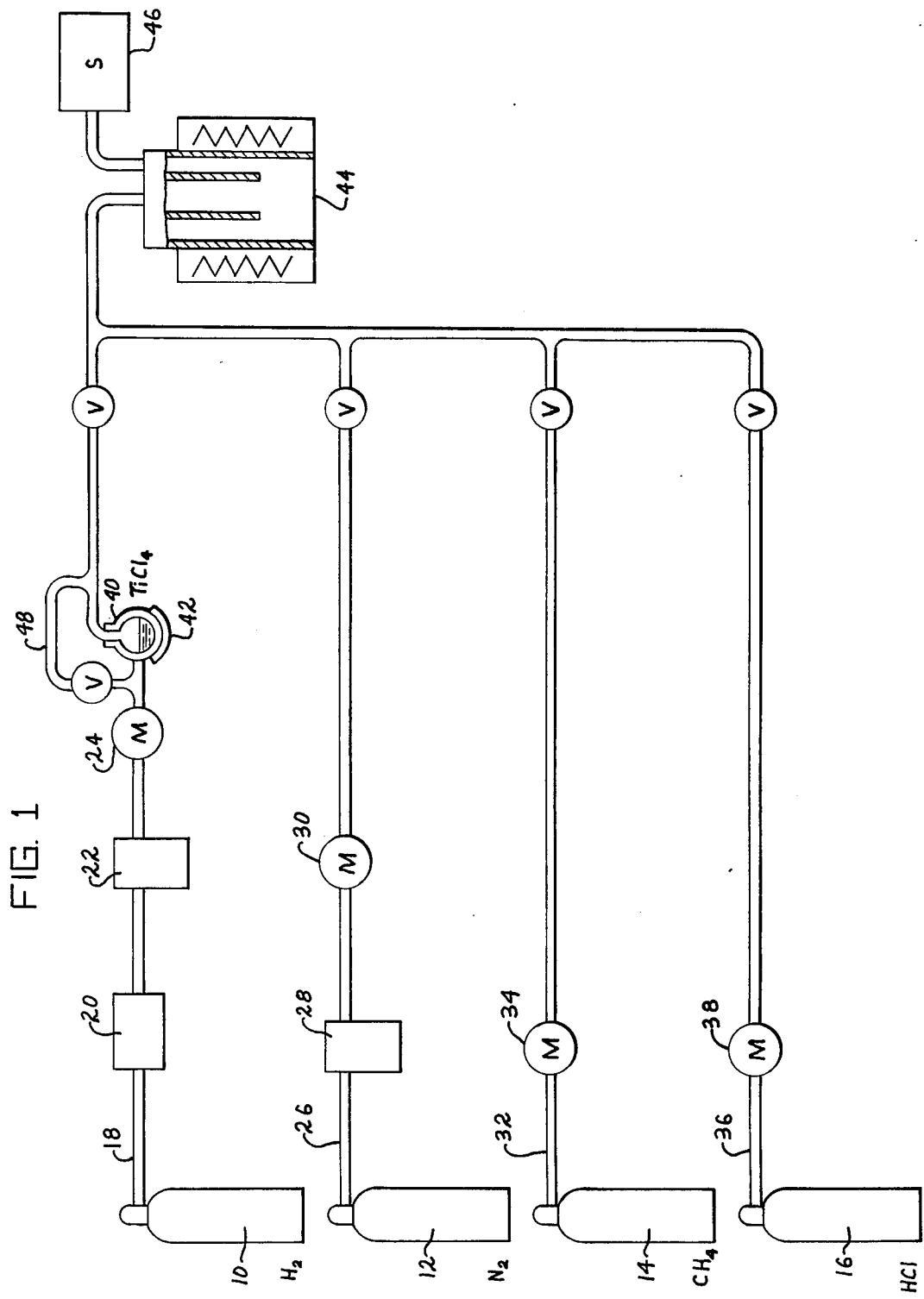

SINTERED CEMENTED CARBIDE BODY COATED WITH THREE LAYERS

BACKGROUND OF THE INVENTION

Cemented hard metal carbide material is advantageously used in many products because of its inherent hardness and wear resistant properties. Such cemented hard metal carbide products have found a wide variety of uses, but probably the widest known use is in cutting inserts used in metal cutting operations.

When cutting inserts are made of carbide material and used to remove metal, the metal chip being removed from the workpiece usually slides over the substrate carbide material thereby producing a frictional wear on the insert which, if it continues long enough, will breck down the cutting edge of the insert and cause a cratering effect inward of the cutting edge on the cutting insert.

Preferably, in this application, reference will be made to cutting inserts using a triple coating applied according to the present invention. However, it is also known that carbide punches used in forming metal materials may also be coated according to the process of the present invention in order to obtain advantageous results.

Coatings for cutting inserts made from cemented carbide materials are known, and the advantages of these coatings are also widely known. For instance, it is known that superior results can be achieved by coating the carbide cutting insert with a first coating of titanium carbide and then providing a top coating of titanium nitride over the first layer of titanium carbide. The advantage found in applying titanium carbide is that the coating layer has an extreme hardness to it, yet, the titanium carbide coating does not have as good a wear resistance as that of titanium nitride.

Therefore, by coating the insert with a first coating of titanium carbide, a superior hardness is achieved, and by putting the coating of titanium nitride above the coating of titanium carbide, a superior wear resistance is achieved. The titanium nitride also has superior advantages in that the coefficient of sliding friction between the titanium nitride coating and the metal chip being removed from the workpiece is less than when the titanium carbide coating or the bare substrate material would have when contacting the metal chip.

It is also known to put a coating of metal nitride by itself on the metal carbide substrate in order to take advantage of the more wear resistant properties of the metal nitride. The metal nitride, however, does not have as good a hardness as that of the metal carbide and, in addition, it has been found that, when the metal nitride coating is used by itself, it tends to spall and flake off and, therefore, does not offer the protection desired for the metal carbide substrate material.

One of the problems that is associated with any coating on a metal carbide substrate is that there is a heat build-up on the coating due to the metal chips being removed from the workpiece, and coatings such as metal nitride over a metal carbide coating, as mentioned above, begin to wear or flake off after a certain period of use.

It is also known to use as a coating on such carbide substrates a metal carbo-nitride coating by itself in order to take advantage of the superior properties of each of the metal carbide or metal nitride compounds.

It is an object of the present invention to apply three layers of coatings on the carbide substrate in such a manner that superior bonding is achieved between the first coating and the substrate material and, also, to advantageously use the superior properties of the metal carbide in conjunction with the metal nitride.

It is a further object of the present invention to provide a carbide substrate which is also resistant to any corrosive atmosphere in which it may operate.

It is a further object of the present invention to provide a longer lasting coating which will prevent the carbide substrate material from wearing away.

BRIEF SUMMARY OF THE INVENTION

According to the present invention, a cemented hard metal carbide substrate material is provided with a first coating comprising a carbide metal selected from a group consisting of titanium, zirconium, hafnium, vanadium, niobium and tantalum in which the first coating is deposited by a chemical vapor deposition process, preferably in such a manner that the coating is carbide deficient.

The deficiency of the carbon in the first coating causes a minute amount of carbon atoms from the substrate structure to migrate into the coating and form a diffusion bond which firmly and adherently bonds the first coating to the substrate material.

The second coating, comprising a carbo-nitride of the selected metal from the above group, is then deposited by a chemical vapor deposition process on the first coating and a diffusion bond is formed between the first coating and the second coating.

A final, and third, coating, comprising a nitride of the selected metal from the above group, is then deposited on the second coating by a chemical vapor deposition process and a diffusion bond again holds the third coating firmly on said second coating.

The method used for coating the articles is, first, to elevate the temperature of the carbide material to approximately 1900° Fahrenheit and then, by reacting methane gas with a metal tetrachloride using a hydrogen carrier, the first layer of metal carbide is deposited. With the first layer of metal carbide deposited, the metal chloride, methane and nitrogen are then reacted in the presence of a hydrogen carrier until the desired thickness of the metal carbo-nitride layer is achieved.

The methane is then shut off and the metal chloride is finally allowed to react with nitrogen in the presence of the hydrogen carrier to form the final metal nitride coating layer on the substrate material.

The exact nature of the present invention will become more clearly apparent upon reference to the following detailed specification taken in connection with the accompanying drawings in which:

FIG. 1 is a basic diagram of the apparatus used to practice the method of coating according to the present invention.

DETAILED DESCRIPTION OF THE INVENTION

According to the present invention, a triple coated insert is provided with a high hardness and long lasting wear characteristics by taking a cemented metal carbide substrate material and putting a first coating on the substrate, which comprises a carbide of a metal selected from the group of titanium, zirconium, hafnium, vanadium, niobium or tantalum. (Hereinafter, when the terms metal nitride, metal carbo-nitride or metal carbide are used, they refer to one of the aboveisted metals.) Such first coating is applied so as to promote a diffusion bond between the first coating and the substrate material.

A second coating is put on top of the first coating, the second coating comprising a metal carbo-nitride. The third and final coating, which is put over the second coating, is a metal nitride coating. It has been found that this arrangement enhances the hardness and wear life of a cemented metal carbide substrate material.

In the prior art, it has already been established that, with cutting tools, titanium carbide and titanium nitride have certain advantages and disadvantages when used as coatings for a cemented carbide substrate material.

It is proposed by the present application that a longer lasting coating can be produced that takes advantage of the superior properties of both the carbide and the nitride when an intermediate coating is used between the metal carbide coating and the metal nitride coating. It has been found, when a metal nitride coating is placed over a metal carbide coating on a cemented carbide metal substrate, that heat which is introduced into the combined coatings will produce a thermal stress on the bonding between the metal carbide coating and the metal nitride coating.

This thermal stress is a result of the fact that the coefficient of thermal expansion is higher for the metal nitride coating than that of the metal carbide coating. Therefore, in any application where heat is being generated by the work being performed, not only will there be abrasive or frictional wear on the metal nitride coating, but the thermal stresses set up between the bonding of the two coatings will tend to break that bonding and allow the protective coating material to deteriorate rapidly.

The present invention takes advantage of the fact that, when the first metal carbide coating is put on the substrate material, it will impart a superior hardness to that substrate material. The first metal carbide coating is, preferably, carbon deficient when applied to the substrate material so that a diffusion bond will occur between the substrate material and the metal carbide coating.

In addition, there is an advantage in that, when the carbon deficient coating is put on the substrate material, carbon atoms will migrate out of the substrate material and produce an eta phase in the surface of the carbide substrate. This eta phase is the carbide substrate material must be kept to a minimum such that the transverse rupture strength of the carbide substrate material is substantially not effected. When kept to a minimal amount, this eta phase will, additionally, act to reduce heat flow into the carbide substrate material which might create thermal deformation of the carbide substrate.

Preferably, the ratio of the carbon atoms to the metal atoms will be about 0.7 and the thickness of the first metal carbide coating will be 3 to 4 microns.

Next, the metal carbo-nitride coating is placed upon the first coating of the metal carbide by a chemical vapor deposition process and diffusion bonding occurs between the second coating of the metal carbo-nitride and the first coating of the metal carbide. The second coating, comprising the metal carbo-nitride coating, is, preferably, 2 to 3 microns in thickness.

The purpose of the second coating being formed of a metal carbo-nitride coating is, first, that its coefficient of thermal expansion will be intermediate of the coefficients of thermal expansion of the metal carbide materials and metal nitride materials thereby reducing the thermal stress levels between the coatings of metal carbide and metal nitride. The second purpose of the metal carbo-nitride coating is that it will easily form firm diffusion bonds between the metal carbide and metal nitride coatings.

The third coating that is applied over the metal carbo-nitride coating is the metal nitride coating which has superior wear or crater resistance over that of the metal carbide coating. The third coating is, preferably, 1 to 2 microns in thickness. With the three coatings applied in this manner, the substrate material has now been provided with a superior hardness due to the initial metal carbide coating and, in addition, now has a superior wear resistance due to the metal nitride coating.

It is mentioned in this application that the cemented carbide substrate is, preferably, comprised of either tungsten carbide, titanium carbide, tantalum carbide, niobium carbide or a mixture thereof, and held together by a matrix metal which is, preferably, from the group of either cobalt or nickel.

The preferred embodiment of the present invention is selecting a substrate material which is comprised of tungsten carbide with a cobalt metal matrix and having a first coating of titanium carbide, which creates a minimal amount of a carbon deficient condition in the substrate, a second coating of titanium carbo-nitride and a third coating of titanium nitride. Several tests have been conducted with the preferred embodiment of the present invention, the results of which are explained in Example 1 below:

EXAMPLE 1

|  | Edge Wear 0.007 ipr | | Edge Wear 0.015 ipr |
| --- | --- | --- | --- |
|  | 200 sq. in. | 250 sq. in. | 75 sq. in. |
| TiC | 0.0112 | 0.0121 | 0.0282 |
| TiC-TiN | 0.0108 | 0.0110 | 0.0257 |
| TiC-TiCN-TiN | 0.0094 | 0.0097 | 0.0218 |

Shown above are the test results of three different coatings placed on a common cemented metal carbide substrate material. The first coating was a titanium carbide coating. The second coating was a titanium carbide first layer coating having a titanium nitride coating superimposed on top of the first coating. The third coating is the coating according to the present invention.

The figures represented by square inch designations are determined by measuring the depth of cut by the length of the cut on a selected metal test bar. The first figures above are the edge wear rate and what is measured is the deterioration of the cutting edge.

The figures are first given for a feed of 0.007 inches per revolution for two time periods. The first time period, the insert at that feed rate removing 200 square inches of material from the test bar and the second figures listing the conditions of the cutting edge at the conclusion of 250 square inches of material removal from the test bar.

The feed rate was then changed to 0.015 inches per revolution and results of the edge wear compared for all three coatings.

The deterioration of the cutting edge is measured inward from the theoretical sharp edge of the cutting insert before it has been used. After it has been used to remove metal, there is a rounding off effect on the cutting edge and the figures used are measuring the distance from the top of the cutting surface that is left out to where the theoretical sharp edge of the cutting insert was located in the beginning.

As can be seen from Example 1, superior edge wear resistance is achieved by the triple coating of the present invention over the coatings of the known prior art.

The above three mentioned coatings were further tested for a transverse rupture strength or an edge strength by subjecting them to a severe interrupted cut condition which was maintained until the edge of the insert fractured. The results of that test showed that there was no difference in the edge strength of the insert for any of the above three listed coatings.

Referring now to FIG. 1, shown therein is a schematic diagram of the equipment used to produce a triple coated insert having for its coatings a first coating of titanium carbide, a second coating of titanium carbo-nitride and a third coating of titanium nitride. The chemical equations utilized by the method are as follows:

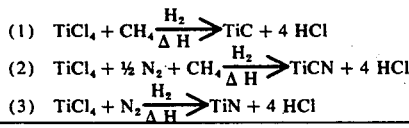

(1) $TiCl_4 + CH_4 \xrightarrow[\Delta H]{H_2} TiC + 4 HCl$ (2) $TiCl_4 + \frac{1}{2} N_2 + CH_4 \xrightarrow[\Delta H]{H_2} TiCN + 4 HCl$ (3) $TiCl_4 + N_2 \xrightarrow[\Delta H]{H_2} TiN + 4 HCl$ Utilizing the equations above, the coatings are produced by a chemical vapor deposition process as described below.

Looking at diagram 1, shown therein is a hydrogen supply 10, nitrogen supply 12, a methane gas supply 14 and a hydrogen chloride supply 16. Shown along hydrogen line 18 is a de-oxidizer unit 20 and a gas dryer 22, the de-oxidizer unit being used to remove any traces of air or oxygen which may usually be found in a commercial grade of bottled hydrogen. The gas dryer 22 is used to remove any water vapor from the hydrogen before the hydrogen is permitted to react with the other gases.

Flow meter 24 is used in the hydrogen line to control or measure the amount of hydrogen that would be necessary to produce reactions according to the above three equations.

Referring to the nitrogen 12 and its supply line 26, installed on line 26 is a gas dryer 28 and a flow meter 30, gas dryer 28 again being used to remove any water vapor that would normally be found in a commercial grade nitrogen supply bottle. Flow meter 30 is again used in the nitrogen line 26 so as to be able to control the flow of nitrogen necessary for the chemical vapor deposition process.

Referring to the methane supply 14 and methane supply line 32, again, a flow meter 34 is located so as to be able to control the amount of methane used in the reaction.

Referring to hydrogen chloride supply 16 and hydrogen chloride supply line 36, this supply also has a flow meter 38, again, in order to be able to control the amount necessary for the coating process.

Referring now to the top hydrogen supply line 18 located in line with which is a liquid metal chloride vaporizer 40 and a heating unit 42. The liquid metal vaporizer unit is a glass lined container which contains the liquid titanium tetrachloride and the heating unit 42 surrounds the titanium tetrachloride with a heated oil bath. The reason for this is that the vapor pressure of the titanium tetrachloride is a function of temperature and by closely controlling the temperature, the titanium tetrachloride input into the system can be controlled.

Referring now to the furnace 44, where the articles to be coated are placed, the furnace has its own distribution system so that gases are fed in and distributed throughout the furnace and thereby coat the substrate materials placed therein. Item 46 is a scrubber unit which is put at the exhaust gas exit of the furnace so as to neutralize the hydrogen chloride gas that is a by-product of the chemical vapor deposition reactions.

The steps of the coating process are as follows:

First, the metal substrate material to be coated is placed in furnace 44 and the nitrogen supply valve is turned on in order to purge the furance of all air. The nitrogen is allowed to run long enough to supply a volume of nitrogen equal to twice the volume of the furnace thereby purging substantially all the air from the furnace. When the air has been purged from the furnace, the nitrogen supply valve is shut off and the hydrogen supply valve is turned on.

At about the same time, the hydrogen supply valve is turned on, the temperature in the furnace is elevated from room temperature to approximately 1900° Fahrenheit and the hydrogen is allowed to flow through the furnace until the furnace reaches the required temperature. When the furnace reaches the required temperature, the hydrogen simply valve is shut off and the hydrogen chloride supply valve is turned on so that the metal substrate material is precleaned with the hydrogen chloride vapor prior to the deposit of the first coating.

After a predetermined amount of time, the hydrogen chloride valve is turned off and a bypass valve on line 48 is closed. The hydrogen supply valve is then turned on and the hydrogen flows through the liquid metal chloride vaporize. The titanium tetrachloride is heated by its oil bath to a predetermined temperature to provide a necessary content of titanium tetrachloride in the hydrogen gas.

When the hydrogen carrier gas is picking up the desired amount of titanium tetrachloride, the methane supply valve is then turned on and the combined gases are allowed to flow through the furnace and provide a non-stoichiometric titanium carbide coating on the substrate material located within the furnace according to the reaction Equation 1 above. When the desired coating thickness of the titanium carbide is achieved, the nitrogen supply valve is then turned on, the methane flow readjusted and the second coating of titanium carbo-nitride is then deposited upon the substrate material according to reaction Equation 2 above.

When a desired thickness of titanium carbo-nitride is achieved, the methane supply valve is shut off and the nitrogen supply valve is adjusted so that enough nitrogen is supplied to form a stoichiometric titanium nitride coating above the titanium carbonitride coating. When the desired thickness of the titanium nitride coating is achieved, the nitrogen supply valve is turned off and the hydrogen bypass valve is turned on to provide a flow of hydrogen gas through the furnace.

The furnace heat is then shut off and the furnace is allowed to cool down to about 300° Centigrade with the hydrogen gas flowing through the furnace. At approximately 300° Centigrade, the nitrogen supply gas is turned on (hydrogen off) so that the entire furnace atmosphere is charged with nitrogen at it cools from 300° Centigrade to room temperature.

The times necessary for deposition each layer are determined by the desired thickness of the coating. As has been mentioned earlier, the desired thicknesses of the coatings are that the first coating of titanium carbide is approximately 3 to 4 microns, the second coating of titanium carbo-nitride is approximately 2 to 3 microns and the third coating of the titanium nitride is approximately 1 to 2 microns.

The cemented metal carbide substrate, when coated according to the present invention, has extreme hardness and tough wear resistant properties and, in addition, the carbide, carbo-nitride and nitride coating are extremely resistant to corrosive atmospheres. Thus, the coated cemented metal carbide substrate is ideal for many uses and applications other than in the metal cutting industry.

The preciseness with which the thickness of the coating may be controlled allows it to be used to "build-up" parts made from a cemented metal carbide material that have worn a small amount and where the small amount of wear would be critical to the operation.

Modifications may be made within the scope of the appended claims.

What is claimed is:

1. A coated cemented carbide product comprising: a sintered cemented metal carbide substrate; a first coating firmly and adherently bonded to said substrate and an eta phase in said substrate immediately beneath said first coating, said first coating comprising a carbide of a metal selected from the group consisting of titanium, zirconium, hafnium, vanadium, niobium and tantalum; a second coating bonded onto said first coating and comprising a carbo-nitride of said selected metal; a third coating bonded on said second coating and comprising a nitride of said selected metal.

2. A coated cemented carbide product according to claim 1 in which the cemented carbide substrate comprises a metal selected from the group of tungsten carbide, titanium carbide, niobium carbide, tantalum carbide or a mixture thereof and a matrix metal selected from the group of cobalt or nickel.

3. A coated cemented carbide product according to claim 2 in which said first coating has a thickness of approximately 3 to 4 microns.

4. A coated cemented carbide product according to claim 3 in which said second coating thickness is approximately 2 to 3 microns.

5. A coated cemented carbide product according to claim 3 in which said third coating thickness is approximately 1 to 2 microns.

6. A coated cemented carbide product according to claim 5 in which said substrate comprises tungsten carbide and a cobalt matrix.

7. A coated cemented carbide product according to claim 6 in which said first coating is titanium carbide.

8. A coated cemented carbide product according to claim 7 in which said second coating is titanium carbo-nitride.

9. A coated cemented carbide product according to claim 8 in which said third coating is titanium nitride.

* * * * *